(12) United States Patent
Li et al.

(10) Patent No.: US 12,069,882 B2
(45) Date of Patent: Aug. 20, 2024

(54) ORGANIC LIGHT EMITTING DISPLAY PANEL AND ORGANIC LIGHT EMITTING DISPLAY APPARATUS

(71) Applicant: Everdisplay Optronics (Shanghai) Co., Ltd., Shanghai (CN)

(72) Inventors: Yanhu Li, Shanghai (CN); Biming Wei, Shanghai (CN); Huan Zheng, Shanghai (CN); Wei Liu, Shanghai (CN); Liang Xu, Shanghai (CN); Hsin Chih Lin, Shanghai (CN); Haiyan Hao, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 427 days.

(21) Appl. No.: 17/551,363

(22) Filed: Dec. 15, 2021

(65) Prior Publication Data
US 2022/0199942 A1   Jun. 23, 2022

(30) Foreign Application Priority Data

Dec. 18, 2020  (CN) .......................... 202011505929.1
Dec. 18, 2020  (CN) .......................... 202023084831.1

(51) Int. Cl.
| | | |
|---|---|---|
| *H01L 51/52* | (2006.01) |
| *H01L 27/32* | (2006.01) |
| *H10K 50/842* | (2023.01) |
| *H10K 50/86* | (2023.01) |
| *H10K 59/12* | (2023.01) |
| *H10K 59/38* | (2023.01) |
| *H10K 102/00* | (2023.01) |

(52) U.S. Cl.
CPC ....... *H10K 50/8426* (2023.02); *H10K 50/865* (2023.02); *H10K 59/12* (2023.02); *H10K 59/38* (2023.02); *H10K 2102/351* (2023.02)

(58) Field of Classification Search
CPC .. H10K 50/8426; H10K 50/865; H10K 59/12; H10K 59/38; H10K 2102/351; H10K 59/8792
See application file for complete search history.

(56) References Cited

U.S. PATENT DOCUMENTS 10,910,593 B2 * 2/2021 Joo .................... H10K 50/8428

* cited by examiner

*Primary Examiner* — David Vu
(74) *Attorney, Agent, or Firm* — Qinghong Xu

(57) ABSTRACT

The present disclosure provides an organic light emitting display panel and an organic light emitting display apparatus. The organic light emitting display panel includes an array substrate, a color filter substrate and a transparent filling layer; the array substrate includes a substrate and an organic light emitting layer and a thin film encapsulation layer sequentially formed on the substrate, and the color filter substrate includes a cover plate and a color filter layer and an organic protective layer sequentially formed on the cover plate; the array substrate and the color filter substrate are disposed opposite to each other, the organic light emitting layer includes a plurality of OLED pixel units, the color filter layer includes a plurality of color-resist units; wherein, the transparent filling layer is disposed in a gap between the array substrate and the color filter substrate for reducing light deflection.

18 Claims, 6 Drawing Sheets

ORGANIC LIGHT EMITTING DISPLAY PANEL AND ORGANIC LIGHT EMITTING DISPLAY APPARATUS

CROSS-REFERENCE

This application claims the benefit of priority to the Chinese Patent Application NO. 202011505929.1, filed on Dec. 18, 2020, and the Chinese Patent Application NO. 202023084831.1, filed on Dec. 18, 2020, the contents of which are both incorporated herein by reference in their entirety.

TECHNICAL FIELD

The present disclosure relates to the field of display technologies, and in particular to an organic light emitting display panel and an organic light emitting display apparatus.

BACKGROUND

Compared with many display devices, organic light emitting display (OLED) devices have numerous advantages, such as all-solid-state, self-luminescence, wide viewing angle, wide color gamut, fast response speed, high luminous efficiency, high brightness, high contrast, ultra-thinness, ultra-lightness, low power consumption, wide operating temperature range, having large-size and flexible panels that can be manufactured, and simple manufacturing processes, and can achieve real flexible display, which can best meet people's requirements for future displays.

In order to improve the contrast of display apparatuses and achieve an integral black effect, the OLED devices typically use polarizers (POL), which can effectively reduce reflection intensity of the external ambient light on the devices. However, light transmittances of the polarizers are generally only about 44%. In order to achieve higher outgoing light brightness, it is necessary to provide more power. Moreover, thicknesses of the polarizers are relatively large and materials of the polarizers are brittle, which are not conducive to the development of dynamic bending products. In order to develop the dynamic bending products based on OLED display technologies, new technologies and new processes have to be introduced to replace the polarizers.

For this reason, the industry usually uses POL free solution (PFS) technologies with color filters (CF) to replace the polarizers. CF structures generally include red (R), green (G) and blue (B) color-resist units and black matrixes (BM). The red (R), green (G) and blue (B) color-resist units need to correspond to red, green, and blue pixel units of the OLED devices, respectively. Through the PFS technologies, not only thicknesses of functional layers may be greatly reduced, but also the light transmittances can be increased from 44% to 80%, which greatly increases the outgoing light brightness, thereby reducing the power consumption of the OLED devices.

SUMMARY

The present disclosure provides an organic light emitting display panel and an organic light emitting display apparatus.

The present disclosure provides an organic light emitting display panel, and the organic light emitting display panel includes: an array substrate, a color filter substrate and a transparent filling layer;

the array substrate includes a substrate and an organic light emitting layer and a thin film encapsulation layer sequentially formed on the substrate, and the color filter substrate includes a cover plate and a color filter layer and an organic protective layer sequentially formed on the cover plate; and the array substrate and the color filter substrate are disposed opposite to each other, the substrate of the array substrate is away from the color filter substrate, the cover plate of the color filter substrate is away from the array substrate, the organic light emitting layer includes a plurality of OLED pixel units, the color filter layer includes a plurality of color-resist units, and the plurality of OLED pixel units and the plurality of color-resist units are disposed in a one-to-one correspondence;

wherein, the transparent filling layer is disposed in a gap between the array substrate and the color filter substrate for reducing light deflection.

The present disclosure also provides an organic light emitting display apparatus, and the organic light emitting display apparatus includes the organic light emitting display panel described above.

BRIEF DESCRIPTION OF THE DRAWINGS

The drawings here are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
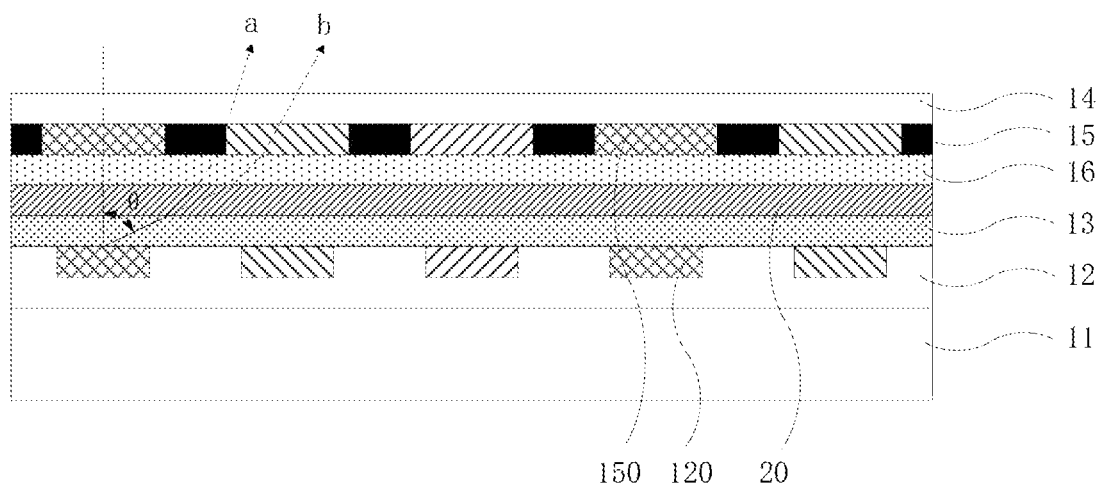
FIG. 1 shows a schematic diagram of a partial structure of an organic light emitting display panel according to an embodiment of the present disclosure.

Example embodiments will now be described more fully with reference to the accompanying drawings. However, the example embodiments can be implemented in a variety of forms and should not be construed as being limited to the embodiments set forth herein; rather, these embodiments are provided so that the present disclosure will be more comprehensive and complete so as to convey the idea of the example embodiments to those skilled in the art. The same reference numerals in the figures denote the same or similar structures, and thus their repeated description will be omitted.

As mentioned above, in order to improve the contrast of display apparatuses and achieve an integral black effect, the OLED devices typically use polarizers (POL), which can effectively reduce reflection intensity of the external ambient light on the devices. However, light transmittances of the polarizers are generally only about 44%. In order to achieve higher outgoing light brightness, it is necessary to provide more power. Moreover, thicknesses of the polarizers are relatively large and materials of the polarizers are brittle, which are not conducive to the development of dynamic bending products. In order to develop the dynamic bending products based on OLED display technologies, new technologies and new processes have to be introduced to replace the polarizers.

For this reason, the industry usually uses POL free solution (PFS) technologies with color filters (CF) to replace the polarizers. CF structures generally include red (R), green (G) and blue (B) color-resist units and black matrixes (BM). The red (R), green (G) and blue (B) color-resist units need to correspond to red, green, and blue pixel units of the OLED devices, respectively. Through the PFS technologies, not only thicknesses of functional layers may be greatly reduced, but also the light transmittances can be increased from 44% to 80%, which greatly increases the outgoing light brightness, thereby reducing the power consumption of the OLED devices.

However, in practical applications, it is found that OLED products manufactured with the PFS technologies generally have problems such as rapid large-viewing-angle brightness attenuation and light crosstalk, which may seriously affect a display effect.

Reference is made to FIG. 1, which is a schematic diagram of a partial structure of an organic light emitting display panel according to an embodiment of the present disclosure. As shown in FIG. 1, the organic light emitting display panel 100 includes: an array substrate, a color filter substrate, and a transparent filling layer 20. The array substrate includes: a substrate 11; and an organic light emitting layer 12 and a thin film encapsulation layer 13 sequentially formed on the substrate 11. The color filter substrate includes: a cover plate 14; and a color filter layer 15 and an organic protective layer 16 sequentially formed on the cover plate 14. The array substrate and the color filter substrate are disposed opposite to each other, the substrate 11 of the array substrate is away from the color filter substrate, and the cover plate 14 of the color filter substrate is away from the array substrate. The organic light emitting layer 12 includes a plurality of OLED pixel units 120, the color filter layer 15 includes a plurality of color-resist units 150, and the plurality of OLED pixel units 120 and the plurality of color-resist units 150 are disposed in a one-to-one correspondence. The transparent filling layer 20 is disposed in a gap between the array substrate and the color filter substrate for reducing light deflection.

The array substrate includes the substrate 11, a thin film transistor (TFT) array layer (not shown in the figure), the organic light emitting layer 12 and the thin film encapsulation (TFE) layer 13 stacked in sequence. The organic light emitting layer 12 includes the plurality of OLED pixel units 120, and the plurality of OLED pixel units 120 include red pixel units R, green pixel units G, and blue pixel units B which are all arranged in an array.

The color filter substrate includes the plurality of color-resist units 150 and a black matrix (not shown with a reference number in the figure), and the plurality of color-resist units 150 include red color-resist units R, green color-resist units G, and blue color-resist units B which are all arranged in the array. The black matrix is also called a light shielding layer or a BM layer, and the black matrix is disposed between adjacent color-resist units 150. The organic protective layer (that is, an OC layer) 16 covers the black matrix and the color-resist units 150. A light transmittance of the black matrix is almost zero, and the light emitted by the OLED pixel units 120 can only be transmitted through the plurality of color-resist units 150.

The array substrate and the color filter substrate are disposed opposite to each other, the substrate 11 of the array substrate is away from the color filter substrate, and the cover plate 14 of the color filter substrate is away from the array substrate. In other words, film layers on the substrate 11 (including the organic light emitting layer 12 and the thin film encapsulation layer 13) and film layers on the cover plate 14 (including the color filter layer 15 and the organic protective layer 16) are all located between the substrate 11 and the cover plate 14. The plurality of color-resist units 150 of the color filter substrate correspond to the plurality of OLED pixel units 120 of the array substrate one by one. In some embodiments, an orthographic projection of a color-resist unit 150 on the substrate 11 is located within an orthographic projection of an OLED pixel unit 120 on the substrate 11.

The transparent filling layer 20 is filled in the gap between the array substrate and the color filter substrate instead of air. Since an optical refractive index (for example, N=1.5) of the transparent filling layer 20 is greater than an optical refractive index (N=1) of the air, the transparent filling layer 20 can reduce the light deflection.

As shown in FIG. 1, when the OLED pixel unit 120 is lit, the emitted light passes through the thin film encapsulation layer 13, the transparent filling layer 20 in sequence, and then reaches the color filter layer 15. When an emitting angle of the light is 0°, the light is perpendicularly incident on the color filter layer 15, and a position where the light is perpendicularly incident on the color filter layer 15 is a center position. When the emitting angle of the light is θ, an exit direction of the light after reaching the color filter layer 15 is shown by an arrow a in the figure, and a distance between a position of the light incident on the color filter layer 15 and the center position is an light path shift distance. In contrast, in the prior art, for the same emitting angle θ, the light passes through the thin film encapsulation layer 13 and the air in sequence, and then reaches the color filter layer 15, and the exit direction of the light after reaching the color filter layer 15 is shown by an arrow b in the figure. It can be seen that disposing the transparent filling layer 20 between the array substrate and the color filter substrate can reduce the light deflection, and the light path shift distance will be smaller.

Further, if the transparent filling layer 20 is not disposed between the array substrate and the color filter substrate, the light with the emitting angle θ may be directly incident on the color-resist unit adjacent to the OLED pixel unit 120, that is, the light may not incident on the color-resist unit corresponding to the OLED pixel unit 120. For example, the light emitted by a red pixel unit R may be incident on a green color-resist unit G or a blue color-resist unit B, causing the light crosstalk. In a case where the transparent filling layer 20 is disposed between the array substrate and the color filter substrate, the light with the emitting angle θ has a shortened light path shift distance, and the light is incident on the black matrix or the color-resist unit corresponding to the OLED pixel unit 120. For example, the light emitted by the red pixel unit R may be incident on the black matrix or the red color-resist unit R to avoid the light crosstalk problem.

In addition, since part of the light is no longer incident on the black matrix after being refracted, but incident on the corresponding color-resist unit, the influence of the black matrix shielding the light is reduced, and the large-viewing-angle brightness attenuation amplitude is reduced.

In some embodiments, a material of the transparent filling layer 20 is optical glue, and an optical refractive index of the optical glue is between 1.2 and 1.8.

In some embodiments, a viscosity of the optical glue is less than 10,000 centi-pascal·second (cps). The viscosity of the optical glue is relatively low, and a uniform and thin optical glue layer (that is, the transparent filling layer 20) can be obtained.

In some embodiments, the OLED pixel units 120 adopt a centrosymmetrical design, which can ensure the same large-viewing-angle effect in 0° and 90° orientations. In some embodiments, openings of the plurality of OLED pixel units 120 and the black matrix are all centrosymmetrical structures, and the centrosymmetrical structure includes a circular structure, a square structure, a rhombic structure or other regular polygonal structures.

Figure 2:
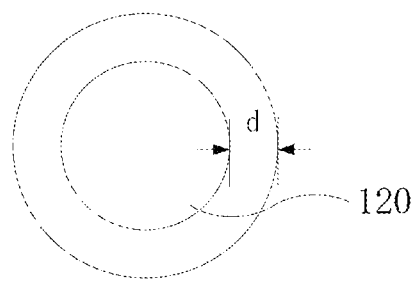
FIG. 2 shows a design diagram in which openings of an OLED pixel unit and a black matrix according to an embodiment of the present disclosure are both circular structures.
Figure 3:
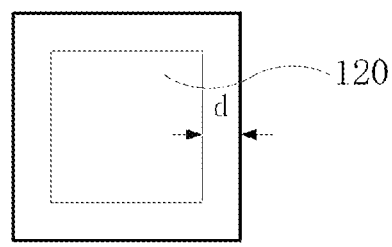
FIG. 3 shows a design diagram in which openings of an OLED pixel unit and a black matrix according to an embodiment of the present disclosure are both square structures.
Figure 4:
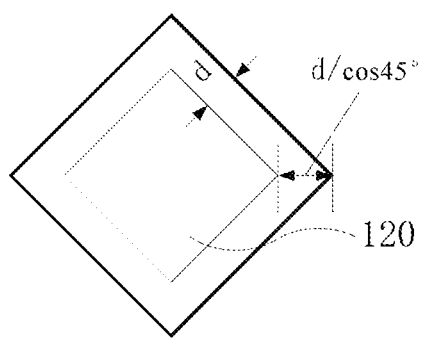
FIG. 4 shows a design diagram in which openings of an OLED pixel unit and a black matrix according to an embodiment of the present disclosure are both rhombic structures.

As shown in FIG. 2, the openings of the OLED pixel unit 120 and the black matrix are both circular, and a distance between the black matrix and the OLED pixel unit 120 is d. As shown in FIG. 3, the openings of the OLED pixel unit 120 and the black matrix are both square, and the distance between the black matrix and the OLED pixel unit 120 is d. As shown in FIG. 4, the openings of the OLED pixel unit 120 and the black matrix are both rhombic, and the distance between the black matrix and the OLED pixel unit 120 is d. When an opening area of the black matrix in the rhombic structure design is the same as an opening area of the black matrix in the square structure design, the distance between the black matrix and the OLED pixel unit 120 becomes as large as d/cos 45° when being viewed at a viewing angle of 0° or 90°, since the rhombus is rotated by 45° relative to the square. Accordingly, the difficulty of alignment (or registration) is reduced, and in addition, since a shielding area of the OLED pixel unit 120 is reduced, the large-viewing-angle brightness attenuation amplitude can be further reduced, and the visual experience is better.

In some embodiments, an overall thickness of the transparent filling layer 20, the organic protective layer 16 and the thin film encapsulation layer 13 is thinner than that of the prior art. In this way, a distance between the organic light emitting layer 12 and the color filter layer 15 can be reduced, and the problems of light crosstalk and attenuation under the large viewing angle can be further improved.

In some embodiments, a thickness of the transparent filling layer 20 is less than 5 μm, a thickness of the organic protective layer 16 is less than 5 μm, and a thickness of the thin film encapsulation layer 13 is less than 12 μm. For example, the thickness of the transparent filling layer 20 is 2 μm, the thickness of the organic protective layer 16 is 3 μm, and the thickness of the thin film encapsulation layer 13 is 6 μm.

In addition, the present disclosure also provides an organic light emitting display apparatus, which includes the organic light emitting display panel 100 described above. Reference may be made to the above content for details, and repeated content will not be given here.

Figure 5:
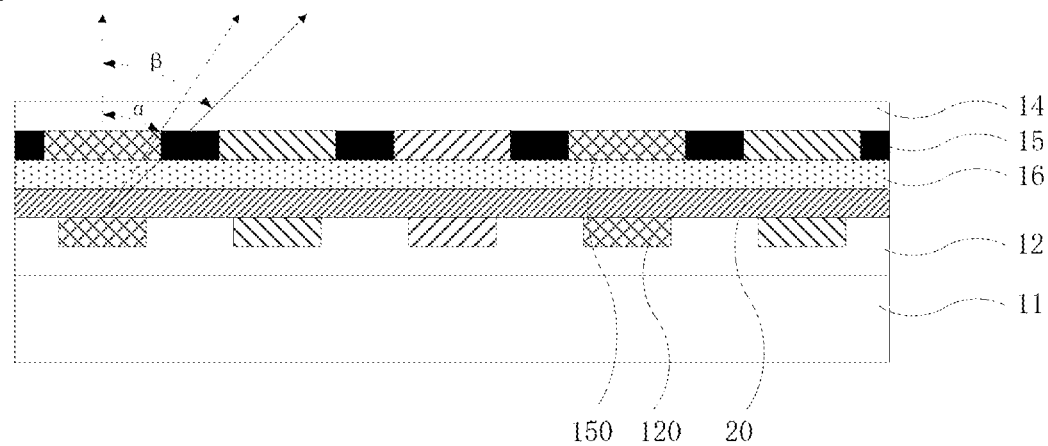
FIG. 5 shows a schematic diagram of a partial structure of an organic light emitting display panel according to another embodiment of the present disclosure.

Reference is made to FIG. 5, which is a schematic diagram of a partial structure of an organic light emitting display panel according to an embodiment of the present disclosure. As shown in FIG. 5, the organic light emitting display panel 200 includes: an array substrate, a color filter substrate, and a transparent filling layer 20. The array substrate includes: a substrate 11; and an organic light emitting layer 12 formed on the substrate 11. The color filter substrate includes: a cover plate 14; and a color filter layer 15 and an organic protective layer 16 sequentially formed on the cover plate 14. The array substrate and the color filter substrate are disposed opposite to each other, the substrate 11 of the array substrate is away from the color filter substrate, and the cover plate 14 of the color filter substrate is away from the array substrate. The organic light emitting layer 12 includes a plurality of OLED pixel units 120, the color filter layer 15 includes a plurality of color-resist units 150, and the plurality of OLED pixel units 120 and the plurality of color-resist units 150 are disposed in a one-to-one correspondence. The transparent filling layer 20 is disposed in a gap between the array substrate and the color filter substrate for reducing light deflection.

The array substrate includes the substrate 11, a thin film transistor (TFT) array layer (not shown in the figure) and the organic light emitting layer 12 stacked in sequence. The color filter substrate includes the plurality of color-resist units 150 and a black matrix (not shown with a reference number in the figure). The array substrate and the color filter substrate are disposed opposite to each other, and the plurality of color-resist units 150 of the color filter substrate correspond to the plurality of OLED pixel units 120 of the array substrate one by one.

In the organic light emitting display panel 200, a thin film encapsulation layer is not disposed on the array substrate, that is, a thickness of the thin film encapsulation layer is zero. In this way, a distance between the organic light emitting layer 12 and the color filter layer 15 becomes closer. In the prior art, the thickness of the thin film encapsulation layer is about 12 μm. Compared with the prior art, the distance between the organic light emitting layer 12 and the color filter layer 15 is reduced by about 12 μm in the organic light emitting display panel 200. Thus, the problems of light crosstalk and attenuation under the large viewing angle are further improved.

Figure 6:
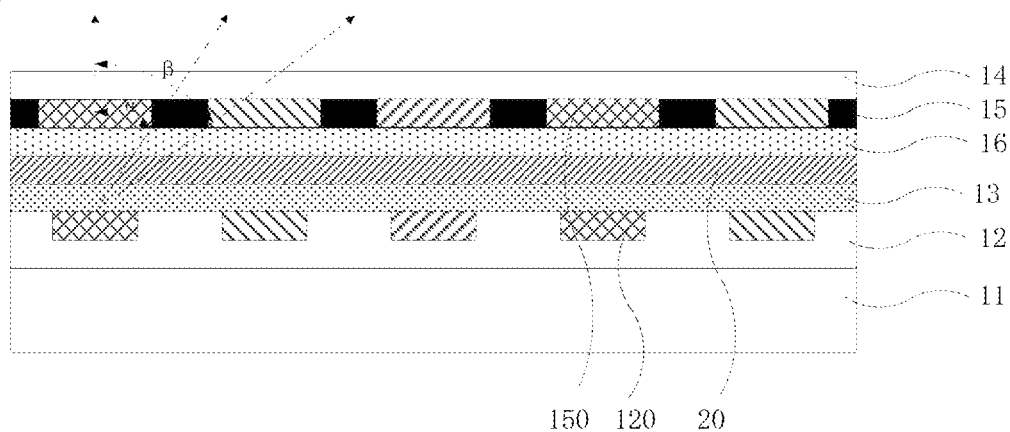
FIG. 6 shows a schematic diagram of a partial structure of an organic light emitting display panel with a thin film encapsulation layer having a thickness consistent with that of the prior art according to an embodiment of the present disclosure.

Reference may be FIGS. 5 and 6, in an organic light emitting display panel with the thin film encapsulation layer of a thickness of 12 μm (i.e., the organic light emitting display panel 100), the light with the emitting angle β may undergo a cross-color phenomenon. The light with the emitting angle between α and β may be shielded by the black matrix. In contrast, in an organic light emitting display panel without the thin film encapsulation layer (i.e., the organic light emitting display panel 200), since the distance between the organic light emitting layer 12 and the color filter layer 15 is reduced, part of the light with the emitting angle β may not undergo the cross-color phenomenon, and the light with the emitting angle between α and β may not be completely shielded by the black matrix.

In some embodiments, the organic light emitting display panel 200 further includes a sealing frame (not shown in the figure), and the sealing frame is connected between an edge of the array substrate and an edge of the color filter substrate, and is used to strengthen a water and oxygen barrier performance of the device. In this way, even if there is no thin film encapsulation layer on the array substrate, the sealing frame can ensure that electrodes and organic layers of the OLED device are not corroded by the water and oxygen, resulting in a reduction in the service lifespan.

In some embodiments, not only the transparent filling layer 20 is disposed in the gap between the array substrate and the color filter substrate, but also the distance between the organic light emitting layer 12 and the color filter layer 15 is shortened, so that the large-viewing-angle optical performance of the PFS products has been greatly improved.

In addition, the present disclosure also provides an organic light emitting display apparatus, which includes the organic light emitting display panel 200 described above. Reference may be made to the above content for details, and repeated content will not be given here.

It should be noted that various embodiments in this specification are described in a progressive manner, and each embodiment focuses on differences from other embodiments, and the same or similar parts between the various embodiments can be referred to each other.

The above drawings merely schematically show the organic light emitting display panel provided by the present disclosure. For the sake of clarity, shapes and quantity of components in the above figures are simplified, and some components are omitted. Those skilled in the art can make changes according to actual needs. These changes are within the protection scope of the present disclosure and will not be repeated here.

In summary, in the organic light emitting display panel and the organic light emitting display apparatus provided by the present disclosure, the transparent filling layer is disposed in the gap between the array substrate and the color filter substrate to reduce the light deflection and improve the problems of rapid large-viewing-angle brightness attenuation and light crosstalk. Further, a distance between the organic light emitting layer and the color filter layer is shortened, thereby reducing influence of black matrix occlusion, and further improving large-viewing-angle optical performance.

The above content is a further detailed description of the present disclosure in combination with specific embodiments, and it cannot be considered that the specific implementations of the present disclosure are limited to these descriptions. For those of ordinary skill in the technical field to which the present disclosure belongs, a number of simple deductions or substitutions can be made without departing from the concept of the present disclosure, which should be regarded as falling within the protection scope of the present disclosure.

What is claimed is:

1. An organic light emitting display panel, comprising:
an array substrate, comprising a substrate, and an organic light emitting layer and a thin film encapsulation layer sequentially formed on the substrate, wherein the organic light emitting layer comprises a plurality of organic light emitting display (OLED) pixel units;
a color filter substrate, comprising a cover plate, and a color filter layer and an organic protective layer sequentially formed on the cover plate, wherein the color filter layer comprises a plurality of color-resist units; and
a transparent filling layer;
wherein the array substrate and the color filter substrate are disposed opposite to each other, the substrate of the array substrate is away from the color filter substrate, and the cover plate of the color filter substrate is away from the array substrate;
the plurality of OLED pixel units and the plurality of color-resist units are disposed in a one-to-one correspondence; and
the transparent filling layer is disposed in a gap between the array substrate and the color filter substrate.

2. The organic light emitting display panel according to claim 1, wherein a material of the transparent filling layer is optical glue, and an optical refractive index of the optical glue is between 1.2 and 1.8.

3. The organic light emitting display panel according to claim 2, wherein a viscosity of the optical glue is less than 10000 cps.

4. The organic light emitting display panel according to claim 1, wherein a thickness of the transparent filling layer is less than 5 μm.

5. The organic light emitting display panel according to claim 1, wherein a thickness of the organic protective layer is less than 5 μm.

6. The organic light emitting display panel according to claim 1, wherein a thickness of the thin film encapsulation layer is less than 12 μm.

7. The organic light emitting display panel according to claim 1, wherein the color filter layer further comprises a black matrix, and the black matrix is disposed between adjacent color-resist units; and
openings of the OLED pixel units and the black matrix are all centrosymmetrical structures.

8. The organic light emitting display panel according to claim 7, wherein the centrosymmetrical structures are square, rhombic or circular.

9. The organic light emitting display panel according to claim 1, wherein an orthographic projection of a color-resist unit on the substrate is located within an orthographic projection of an OLED pixel unit on the substrate.

10. An organic light emitting display apparatus, comprising: an organic light emitting display panel, wherein the organic light emitting display panel comprises:
an array substrate, comprising a substrate, and an organic light emitting layer and a thin film encapsulation layer sequentially formed on the substrate, wherein the organic light emitting layer comprises a plurality of organic light emitting display (OLED) pixel units;
a color filter substrate, comprising a cover plate, and a color filter layer and an organic protective layer sequentially formed on the cover plate, wherein the color filter layer comprises a plurality of color-resist units; and
a transparent filling layer;
wherein the array substrate and the color filter substrate are disposed opposite to each other, the substrate of the array substrate is away from the color filter substrate, and the cover plate of the color filter substrate is away from the array substrate;
the plurality of OLED pixel units and the plurality of color-resist units are disposed in a one-to-one correspondence; and
the transparent filling layer is disposed in a gap between the array substrate and the color filter substrate.

11. The organic light emitting display apparatus according to claim 10, wherein a material of the transparent filling layer is optical glue, and an optical refractive index of the optical glue is between 1.2 and 1.8.

12. The organic light emitting display apparatus according to claim 11, wherein a viscosity of the optical glue is less than 10000 cps.

13. The organic light emitting display apparatus according to claim 10, wherein a thickness of the transparent filling layer is less than 5 μm.

14. The organic light emitting display apparatus according to claim 10, wherein a thickness of the organic protective layer is less than 5 μm.

15. The organic light emitting display apparatus according to claim 10, wherein a thickness of the thin film encapsulation layer is less than 12 μm.

16. The organic light emitting display apparatus according to claim 10, wherein the color filter layer further comprises a black matrix, and the black matrix is disposed between adjacent color-resist units; and openings of the OLED pixel units and the black matrix are all centrosymmetrical structures.

17. The organic light emitting display apparatus according to claim 16, wherein the centrosymmetrical structures are square, rhombic or circular.

18. The organic light emitting display apparatus according to claim 10, wherein an orthographic projection of a color-resist unit on the substrate is located within an orthographic projection of an OLED pixel unit on the substrate.

* * * * *